(12) United States Patent
Chander et al.

(10) Patent No.: US 8,196,076 B2
(45) Date of Patent: Jun. 5, 2012

(54) OPTIMAL FLOW IN DESIGNING A CIRCUIT OPERABLE IN MULTIPLE TIMING MODES

(75) Inventors: Roopesh Chander, Bangalore (IN); Rajagopal Kollengode Ananthanarayanan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 616 days.

(21) Appl. No.: 12/272,890

(22) Filed: Nov. 18, 2008

(65) Prior Publication Data

US 2009/0132984 A1    May 21, 2009

(30) Foreign Application Priority Data

Nov. 19, 2007   (IN) ............................ 2682/CHE/2007

(51) Int. Cl.
*G06F 17/50* (2006.01)

(52) U.S. Cl. ........................................ 716/108; 716/107
(58) Field of Classification Search ........... 716/110–114
See application file for complete search history.

(56) References Cited

U.S. PATENT DOCUMENTS 6,904,579 B2 * 6/2005 Katla et al. .................... 716/108
7,523,426 B2 * 4/2009 Dirks et al. .................... 716/113

* cited by examiner

*Primary Examiner* — Jack Chiang
*Assistant Examiner* — Binh Tat
(74) *Attorney, Agent, or Firm* — John R. Pessetto; W. James Brady; Frederick J. Telecky, Jr.

(57) ABSTRACT

A design approach provided according to an aspect of the present invention consolidates the constraint files of respective modes into consolidated information and performs place-and-route using such consolidated information. The resource requirements may be reduced as result. Another aspect of the present invention provides a programmatic approach to consolidating timing constraint files of different timing modes into consolidated information.

5 Claims, 8 Drawing Sheets

610

| MODE | CONSTRAINT | NODE | PARAMETERS |
|---|---|---|---|
| F1 | CLOCK NAME: FCLK1 | FCLK1 | PERIOD: 1.1ns |
| F1 | CLOCK NAME: FCLK2 | FCLK2 | PERIOD: 1.2ns |
| F1 | CASE SETTING | FSEL | VALUE: 0 |

| MODE | CONSTRAINT | NODE | PARAMETERS |
|---|---|---|---|
| F2 | CLOCK NAME: FCLK1 | FCLK1 | PERIOD: 1.1ns |
| F2 | CLOCK NAME: FCLK2 | FCLK2 | PERIOD: 1.2ns |
| F2 | CASE SETTING | FSEL | VALUE: 1 |

| MODE | CONSTRAINT | NODE | PARAMETERS |
|---|---|---|---|
| SUPER | CLOCK NAME: FCLK1_F1 | FCLK1 | PERIOD: 1.1ns |
| SUPER | CLOCK NAME: FCLK2_F1 | FCLK2 | PERIOD: 1.2ns |
| SUPER | CLOCK NAME: FCLK1_F2 | FCLK1 | PERIOD: 1.1ns |
| SUPER | CLOCK NAME: FCLK2_F2 | FCLK2 | PERIOD: 1.2ns |
| SUPER | FALSE PATH | | FROM: *_F1 CLOCKS TO: *_F2 CLOCKS |
| SUPER | FALSE PATH | | FROM: *_F2 CLOCKS TO: *_F1 CLOCKS |

| MODE | CLOCK | STOPPED AT |
|------|-------|------------|
| F1 | FCLK2 | MUX640/642 |
| F2 | FCLK1 | MUX640/642 |

| MODE | CLOCK | NODE | UNATENESS |
|------|-------|------|-----------|
| F1 | FCLK1 | XOR650/653 | POSITIVE |
| F2 | FCLK2 | XOR650/653 | NEGATIVE |

| MODE | CONSTRAINT | NODE | PARAMETERS |
|------|------------|------|------------|
| SUPER | CLOCK-STOP | MUX/Y | CLOCK: FCLK2_F1 |
| SUPER | CLOCK-STOP | MUX/Y | CLOCK: FCLK1_F2 |
| SUPER | CLOCK-UNATENESS | XOR/Y | CLOCK: FCLK1_F1 UNATENESS: POSITIVE |
| SUPER | CLOCK-UNATENESS | XOR/Y | CLOCK: FCLK2_F2 UNATENESS: NEGATIVE |

*FIG. 8C*

| MODE | CONSTRAINT | NODE | PARAMETERS |
|---|---|---|---|
| F1 | CLOCK NAME: FCLK | CLK | PERIOD: 1.1ns |
| F1 | CASE SETTING | FSEL | VALUE: 0 |
| F1 | CASE SETTING | SCAN_EN | VALUE: 0 |

1010

| MODE | CONSTRAINT | NODE | PARAMETERS |
|---|---|---|---|
| F2 | CLOCK NAME: FCLK | CLK | PERIOD: 1.2ns |
| F2 | CASE SETTING | FSEL | VALUE: 1 |
| F2 | CASE SETTING | SCAN_EN | VALUE: 0 |

1020

| MODE | CONSTRAINT | NODE | PARAMETERS |
|---|---|---|---|
| SCAN | CLOCK NAME: TCLK | CLK | PERIOD: 3.0ns |
| SCAN | CASE SETTING | SCAN_EN | VALUE: 1 |

| | MODE | CELL | FROM NODE | TO NODE | DISABLED ARC TYPES | REASON |
|---|---|---|---|---|---|---|
| R1 → | F1 | MUX 950 | 945 | 956 | COMBINATIONAL | FSEL=0 |
| R2 → | F2 | MUX 950 | 935 | 956 | COMBINATIONAL | FSEL=1 |
| R3 → | F1, F2 | MUX 950 | SEL (902) | 956 | COMBINATIONAL | FSEL=0/1 |
| R4 → | F1, F2 | FF 990 | CK (901/CLK) | SD (979) | SETUP, HOLD | SCANEN=0 |
| R5 → | F1, F2, SCAN | FF 990 | CK (901/CLK) | SD (907) | SETUP, HOLD | SCANEN=0/1 |
| R6 → | SCAN | FF 990 | CK (901/CLK) | D (969) | SETUP, HOLD | SCANEN=1 |

*FIG. 10B*

| | MODE | CONSTRAINT | PARAMETERS |
|---|---|---|---|
| R1 → | SUPER | FALSE PATH | FROM: FCLK_F1 CLOCK<br>THROUGH: MUX950/945<br>THROUGH: MUX950/956 |
| R2 → | SUPER | FALSE PATH | FROM: FCLK_F2 CLOCK<br>THROUGH: MUX950/935<br>THROUGH: MUX950/956 |
| R3 → | SUPER | FALSE PATH | FROM: FCLK_* CLOCKS<br>THROUGH: MUX950/SEL<br>THROUGH: MUX950/956 |
| R4 → | SUPER | FALSE PATH | FROM: FCLK_* CLOCKS<br>TO: FF 990/SD |
| R5 → | SUPER | DISABLE TIMING | FROM: FF990/CK<br>TO: FF990/SE |
| R6 → | SUPER | FALSE PATH | FROM: TCLK_SCAN CLOCK<br>TO: FF990/D |

*FIG. 10C*

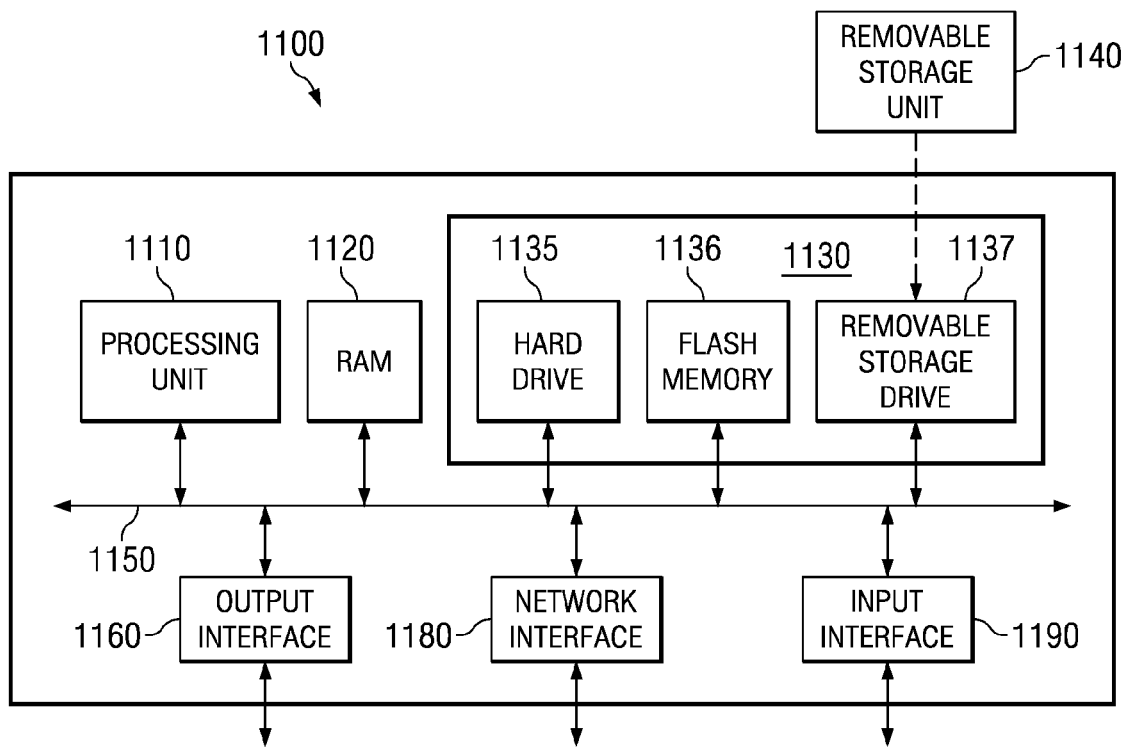

*FIG. 11*

OPTIMAL FLOW IN DESIGNING A CIRCUIT OPERABLE IN MULTIPLE TIMING MODES

RELATED APPLICATION

The present application claims the benefit of co-pending India provisional application serial number: 2682/CHE/2007, entitled: "Method to automatically derive timing constraints to enable optimization of digital circuits across multiple modes", filed on 19 Nov. 2007, naming Texas Instruments Inc. (the intended assignee) as the Applicant, and naming the same inventors as in the present application as inventors, and is incorporated in its entirety herewith.

BACKGROUND OF THE INVENTION

1. Technical Field

The present disclosure relates to integrated circuit (IC) design, and more specifically to an optimal flow to design an IC operable in multiple timing modes.

2. Related Art

Circuits are often implemented to operate in multiple timing modes. Each timing mode is associated with a corresponding desired set of user level features such that the resource requirements (one or more of processing power, timing constraints, operation of different components, amount of memory space required, etc.) to provide the features corresponding to different modes are substantially different.

For example, an integrated circuit (IC) contained in a communication device such as a mobile phone, may be designed to provide video and audio features, and thus may be viewed as operable in a video mode, an audio mode, and a mode in which both video and audio are processed. Due to the different user level features provided in different timing modes, the resource requirements may be different in different timing modes.

In view of the differences of resource requirements, an IC may be designed to contain some circuit portions which operate (i.e., active to process signals) in the video mode (when providing video features, such as, for example, transferring or displaying images), other circuit portions that operate in the audio mode (to play music, for example), etc, and circuit portions that are operational in both video and audio modes. Alternatively or in addition, some portions may operate at different clock speeds while operating in different modes.

As is well known in the relevant arts, the design of a circuit (for example, an integrated circuit) generally follows a sequence of stages, commonly termed design flow, and which may be performed using corresponding electronic design automation (EDA) tools. A digital IC, for example, may first be specified/described in terms of the logic required to be implemented (e.g., via RTL coding using VHDL, Verilog, etc).

The logic description may generate an output specifying the various circuit components and their interconnections. The components and their interconnections may then be "placed and routed" to fit in a desired silicon die area. A timing analysis may then be performed on the placed-and-routed circuit to verify if timing of signals at various nodes is as desired. A final set of data completely describing the circuit may then be generated and provided for fabricating the IC.

Several challenges present themselves in the design flow while designing a circuit that may operate in multiple timing modes. It is generally desirable to render the design flow optimal (in terms reduced time, minimal computing and storage resources, etc) when designing such a circuit.

SUMMARY

A design approach provided according to an aspect of the present invention consolidates the constraints files of respective modes into consolidated information/set (super mode set), and performs place-and-route phase for an integrated circuit (IC) using such consolidated information. The number of iteration of various phases and resource requirements may be reduced as a result.

Another aspect of the present invention provides a programmatic approach to consolidating timing constraint files of different timing modes into consolidated information. Due to such a programmatic approach, consolidated information can be generated even for complex integrated circuits.

In an embodiment, a constraints merger block identifies a first set of constraints, with each constraint corresponding to the same signal, and being the same/identical for all timing modes, and adds a corresponding single constraint for each constraint in the first set of constraints to the consolidated set.

The constraints merger block may further identify, for each timing mode, which signals would propagate through which nodes in the IC. In case of a clock signal, if there is at least one constraint not contained in the first set of constraints, a corresponding qualified signal is generated having the same properties as the clock signal for each timing mode.

Further, for each pair of qualified clock signals, corresponding false paths (such as data paths) are identified, with each false path being in a "don't care" condition in generating the placed and routed circuit. Alternatively, the data signal would not propagate to/through the path in the corresponding timing mode to qualify as a false path. The constraints merger block adds corresponding constraints to reflect the qualified clock signals and the false paths.

In case of a clock signal, the constraints merger block further identifies nodes in the integrated circuit, at which a clock signal is not propagated further, and adds corresponding clock-stop constraints in the super mode set. Similarly, the unateness of the clock signal is identified, and corresponding information is also added to the super mode set.

Constraints merger block identifies nodes in the integrated circuit at which the data signal is not propagated further due to case settings. The corresponding clock signal, which causes the data signal to arrive at these nodes, is also identified. The constraints merger block identifies a path clocked by a corresponding qualified clock (created for the super mode set), and which terminates at these nodes as false paths, and adds corresponding constraints to the consolidated set (super mode constraints).

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

BRIEF DESCRIPTION OF THE DRAWINGS

Example embodiments of the present invention will be described with reference to the accompanying drawings briefly described below.

FIG. 6A is an example file in tabular format, containing clock timing constraints in one timing mode.

FIG. 6B is an example file in tabular format, containing clock timing constraints in another timing mode.

FIG. 7 is file in tabular format, containing a portion of consolidated clock timing constraints for the input timing constraints of FIGS. 6A and 6B.

FIG. 8A is a table containing clock-stop information determined for each mode of an example circuit.

FIG. 8B is a table containing clock unateness information determined for each mode of an example circuit.

FIG. 8C is a table containing clock constraints with respect to clock-stop and clock unateness in an example consolidated constraints file.

FIG. 10A is a diagram containing timing constraints tables for three timing modes.

FIG. 10B is a table containing inferred set cases and disabled arcs for the timing constraints of FIG. 10A.

FIG. 10C is file in tabular format, containing a portion of consolidated timing constraints for the input timing constraints of FIG. 10A.

FIG. 11 is a block diagram illustrating the details of an embodiment of a device implemented substantially in the form of software according to an aspect of the present invention.

In the drawings, like reference numbers generally indicate identical, functionally similar, and/or structurally similar elements. The drawing in which an element first appears is indicated by the leftmost digit(s) in the corresponding reference number.

DESCRIPTION OF EXAMPLE EMBODIMENTS

1. Example Environment

Figure 1A:
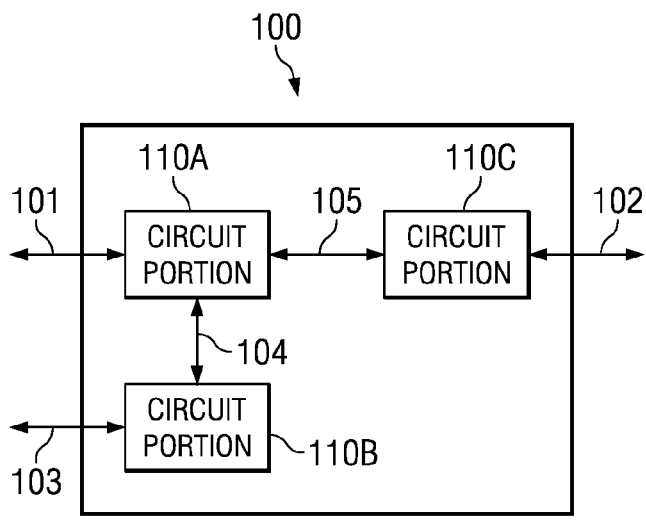
FIG. 1A is a block diagram of an example integrated circuit (IC) operable in different timing modes.
Figure 1B:
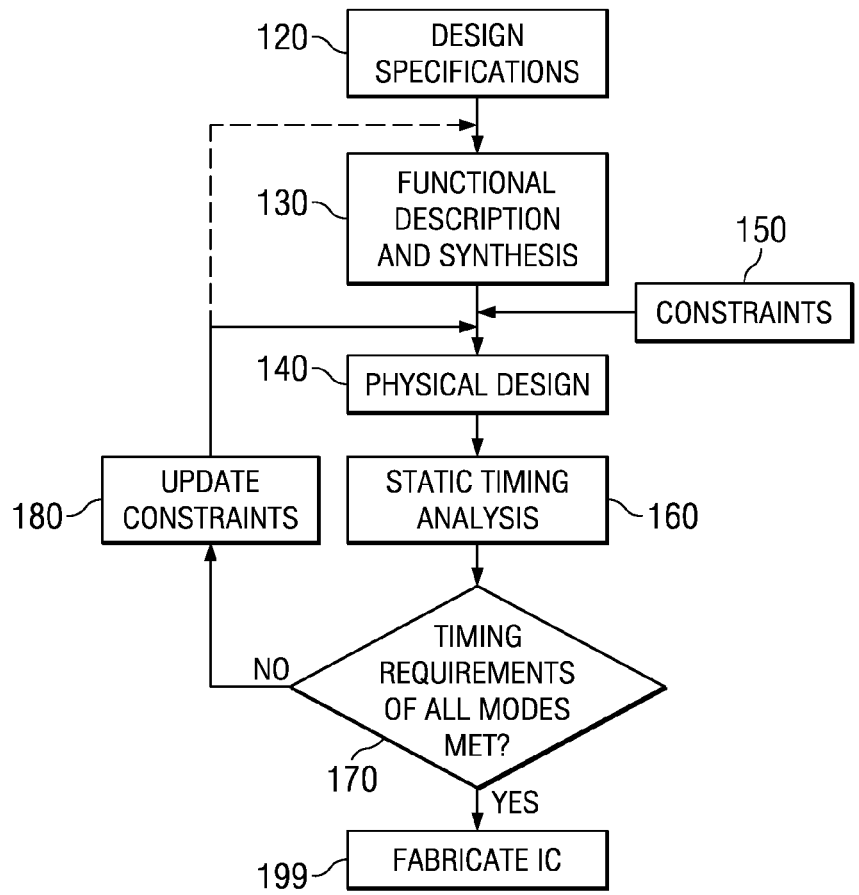
FIG. 1B is flow diagram illustrating a typical design flow in designing an IC.

FIGS. 1A and 1B together illustrate an example environment/context in which several aspects of the present invention can be applied. FIG. 1A shows a block diagram of an example IC 100 containing circuit portions 110A, 110B and 110C. Path 104 represents signals (clock, data etc.) that may be transferred between circuit portions 110A and 110B, while path 105 represents signals that may be transferred between circuit portions 110A and 110C. Paths 101, 102 and 103 represent signals that may be transferred between (corresponding portions of) IC 100 and circuits outside of IC 100. Circuit portions 110A, 110B and 110C may each contain circuitry/components within that may be designed to be operable in multiple timing modes. IC 100 may contain digital as well as analog/mixed signal portions.

FIG. 1B illustrates a typical design flow in designing an IC such as IC 100. The design flow is shown merely for the purpose of illustration, and may include other/alternative phases, and possibly other sequences of the phases as well. The design may start with design specifications (120), in which the specifications of IC 100 may be generated. A functional description followed by synthesis of the description into a circuit corresponding to the specifications (120) may then be performed in step 130. Functional description and synthesis (130) may generate a netlist (specifying interconnections between the various components/blocks in the design), as well as a library of the components contained in the design.

Physical design (140) may be performed next, and generally involves placement of components in the circuit, and routing the interconnection between the components. As is well known in the relevant arts, for IC 100 (simply referred to below also as a circuit) to operate as desired, timing requirements of various paths/nodes (through which signals such as clocks and data propagate) in the IC need to be ensured. For example, parameters of clock signals, such as duty cycle or clock period, clock skew, clock latency etc., may need to be specified.

Similarly, input/output delay requirements of all ports relative to a clock transition may also need to be specified. Typically, given the specifications of the clock, register to register paths (registers operations being controlled by the clock) are assumed to be constrained in one clock cycle. The input delay generally specifies the time the output of an external device a primary input (e.g., a pin on the IC) to a register in the IC. An output delay is generally the delay the output of a register in the IC through a primary output (e.g., output pin) to an external device (e.g. input of another IC).

Various other requirements such as (but not limited to) timing exceptions such as multi-cycle paths and false paths may also be need to be specified. Such specifications are generally termed timing constraints, and may be provided in a constraints file (150) to the physical design step 140. As is well known, timing constraints are associated with signal paths and/or signals, and specify the time related characteristics (delays encountered, periods, clock skews in case of clock signals, etc.) of the signal in the paths.

As is also well known, physical design (140) may generate as an output the physical layout of the components in the circuit, post-placement timing of various signals in the circuit, information regarding parasitic elements in the physical layout, etc. In some instances (based on the specific implementation of the physical design tool), the physical design step (140) may also provide post-placement timing information of the signals in the circuit.

Static timing analysis (160) may be performed as a next step, in which the arrival times of the signals at various paths/nodes in the design are estimated, typically based on delay models (gate delays, connection-path or wire delays, etc., based on the output of the physical design step 140), as is well known in the relevant arts. The corresponding timings at the various nodes may be checked against desired timing requirements (i.e., a comparison of arrival times against required times is made, whether set-up and hold times of clocked components/registers are acceptable, etc). In general, the circuit is optimized by measuring timing slacks (difference between arrival times and required times) at all nodes of the circuit as per the set of timing constraints (160), and changing the design to fix or improve all negative slacks (arrival time is later then required time).

If the desired timing requirements are met, the output of the physical design process is sent for fabricating (199) the IC. If the timing requirements are not met, then physical design (140) may be performed again. The constraints may also be updated if necessary (180). In some instances, functional design (130) may be modified, if necessary, and the following steps may be repeated till the timing requirements are met. Thus, the design flow procedure noted above may be iterative.

Functional design (130), physical design (140) and static timing analysis (160) may be performed by an engineer/operator using corresponding EDA tools. Specifically, the tool used for physical design (140) may be capable of accepting a single set of timing constraints only. As noted above, however, an IC may have multiple timing modes of operation, generally representing different scenarios (applications) in which the circuit can be used. Each timing mode may have a distinct set of timing constraints. Consequently, to ensure that the circuit works (operates as desired at the desired operating clock frequency) correctly under all modes of operation, it generally needs to be ensured that the timing requirements of each mode are met.

Several aspects of the present invention optimize the design flow for a circuit operable in multiple timing modes. Various features of the present invention will be clear in comparison with a prior design for a circuit operable in multiple timing modes. Accordingly, the description of such a prior approach is provided first.

2. Example Prior Approach

Figure 2:
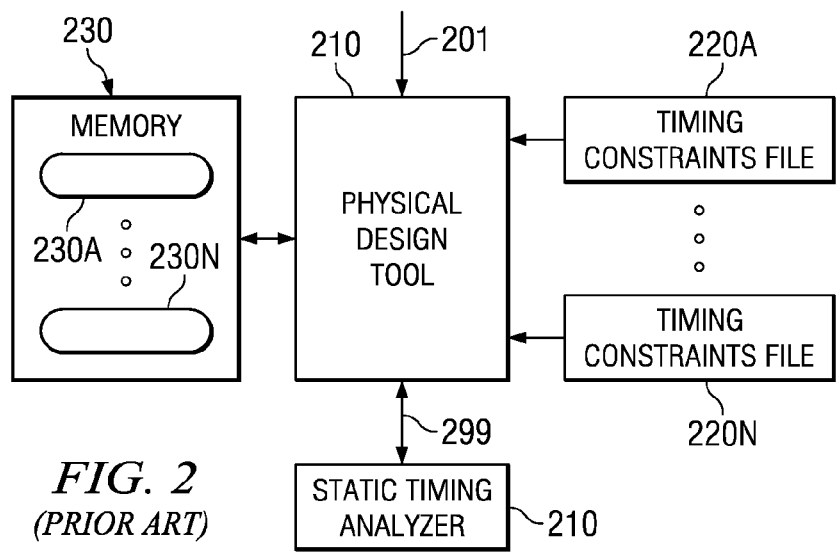
FIG. 2 is diagram illustrating partially a prior design flow approach to designing an IC, operable in multiple timing modes.

A prior design flow approach to designing a circuit (IC, in general) provides a physical design tool with multiple sets of timing constraints, with each set corresponding to a timing mode. As shown in FIG. 2, physical design tool 210 is provided with N timing constraints files, 220A through 220N, with each of the files containing timing constraints for a corresponding one of the multiple timing modes (N in the example) of operation of the circuit. In addition, physical design tool 210 receives corresponding inputs relating to the functional description of the circuit (indicated by path 201) from a functional design step (similar to that shown in FIG. 1B). As noted above with respect to FIG. 1B, such inputs may be in the form of a netlist and library of the components contained in the design.

Physical design tool 210 receives 'N' constraints files 220A-220N, and performs an STA for each mode (a total of N STAs), by invoking static timing analyzer 210 (via path 299) for each STA. Physical design tool 210 collects slack information on each physical node in the design obtained from each of the N STAs, determines the minimum slack across all nodes, and uses the minimum slack information for place-and-route. The measurement of timing slacks may be done either by physical design tool 210 itself or using an external timing analysis tool (not shown, but invoked via path 299).

Physical design tool 210 stores in memory (230), outputs 230A-230N containing the slack information obtained for each of the N analyses. In addition physical design tool 210 may store information representing post-placement timing of various signals in the circuit, information regarding parasitic elements in the physical layout, etc.

However, the above approach may have several drawbacks. For example, the approach might be computationally intensive in terms of time (longer run-time) and usage of resources (such as size of memory 230), and therefore may not be an "optimal" approach. Since physical design tool 210 has to store the slacks for each mode, the approach often results in a high memory (RAM) usage. In terms of computing time usage (CPU usage), the multiple STA runs in the prior approach may utilize higher CPU time, at least in the later part of the design flow where more detailed delay calculation may need to be computed.

Several aspects of the present invention overcome the drawbacks noted with respect to prior approach, and are described next.

3. Merging Timing Constraints

Figure 3:
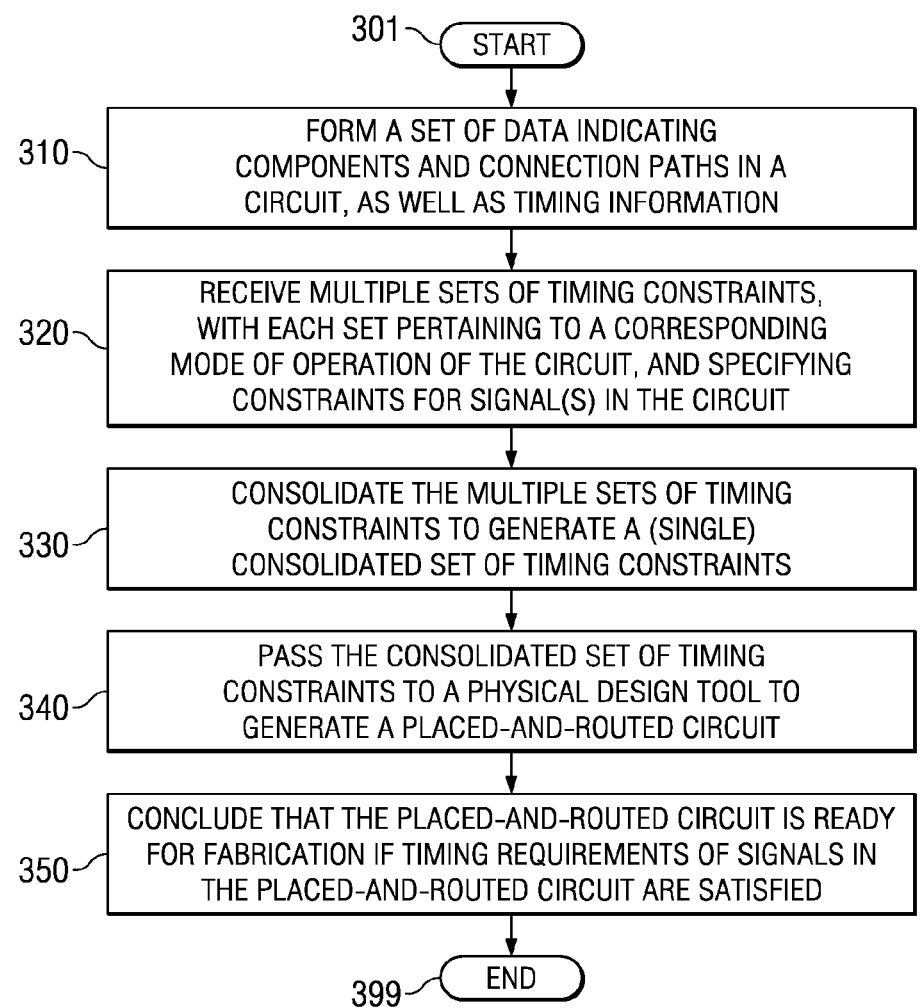
FIG. 3 is a flowchart illustrating a flow for designing an IC circuit operable in multiple timing modes, in an embodiment of the present invention.

FIG. 3 is a flowchart illustrating a flow for designing a circuit operable in multiple timing modes in an embodiment of the present invention. The flowchart is described with respect to FIG. 1B, merely for illustration. However, various features can be implemented in other environments and other components. Furthermore, the steps are described in a specific sequence merely for illustration. Alternative embodiments in other environments, using other components, and different sequence of steps can also be implemented without departing from the scope and spirit of several aspects of the present invention, as will be apparent to one skilled in the relevant arts by reading the disclosure provided herein. The flowchart starts in step 301, in which control passes immediately to step 310.

In step 310, a set of data is formed, with the set of data indicating components and connection paths in the circuit, as well as timing information. The connecting paths provide signal paths between at least a pair of components, and the timing information specify expected time delays in signal propagation through the components and the connection paths. The set of data formed may include a synthesized netlist and a library of components used in the circuit. Control then passes to step 320.

In step 320, a plurality of sets of timing constraints is received, with each set pertaining to a corresponding one of the multiple timing modes, and specifying a set of constraints for signals in the circuit. Each set of timing constraints may contain desired operational parameters such as clock frequency, clock uncertainty, input and output delays, etc. Control then passes to step 330.

In step 330, the multiple sets of timing constraints are consolidated to generate a (single) consolidated set of timing constraints. The manner in which such consolidation is performed in an embodiment of the present invention is described in detail in sections below. Control then passes to step 340.

In step 340, the consolidated set of timing constraints is passed to a physical design tool to generate a placed-and-routed circuit using the respective time delays formed in step 310. Control then passes to step 350.

In step 350, the placed-and-routed circuit is processed using a timing analysis tool to check whether the timing information is satisfied by the placed-and-routed circuit. If the timing information is satisfied, it may be concluded that the placed-and-routed circuit is ready for fabrication. Though not shown in FIG. 3, steps 340 and 350 may be repeated, with potentially changes to the consolidated set, until the timing information is satisfied. The flowchart ends in step 399.

It should be appreciated that the consolidation of step 330 ensures that the physical design tool processes the timing constraints for all the modes, in a single pass. The processing requirements may be reduced as a result. In addition (and in contrast with the prior approach noted above), since slacks for each mode are not generated separately, total slack information that may be generated and need to be stored may be much lesser in comparison, thereby requiring lesser storage (RAM) resources.

The manner in which the features described in step 330 are obtained in an embodiment of the present invention is described in detail in sections below with illustrative examples. First, a brief description of the various blocks operating to provide the features noted above is provided.

4. Operational Blocks

Figure 4:
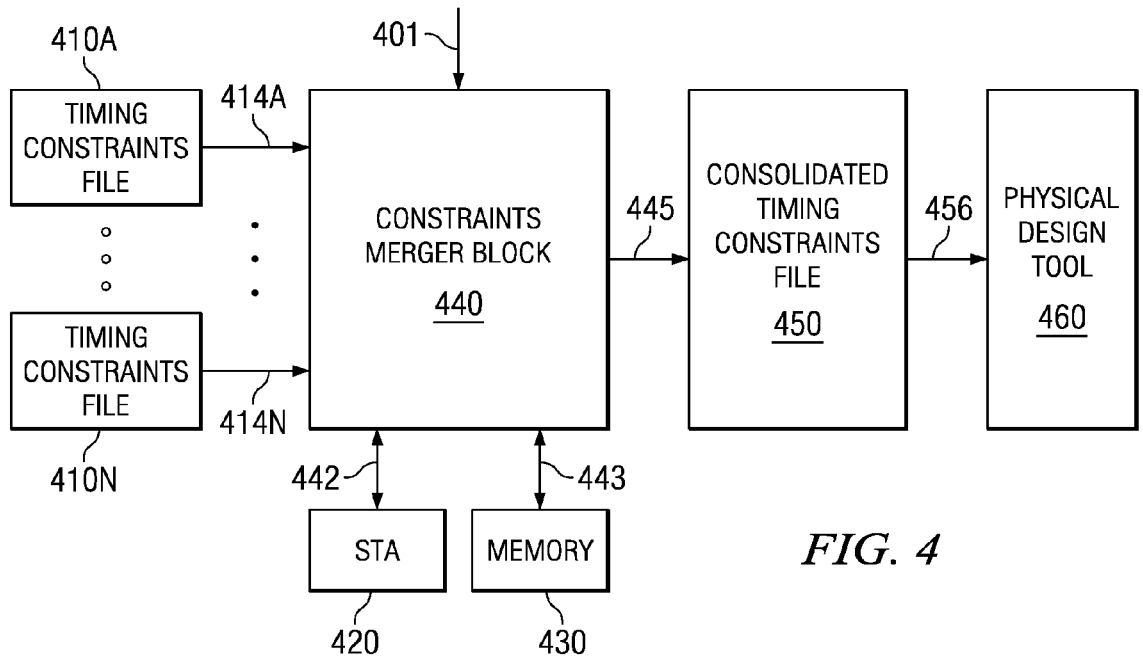
FIG. 4 is a block diagram illustrating the various operational blocks and their interactions operating to consolidate multiple sets of timing constraints into a single consolidated set.

FIG. 4 is a block diagram illustrating the various blocks and their interactions in providing the features noted above, in an embodiment of the present invention. The diagram is shown containing timing constraints files 410A through 410N, static timing analyzer (STA) 420, memory 430, constraints merger block 440, consolidated timing constraints file 450, and physical design tool 460.

Constraints merger block 440 receives design information specifying an IC via path 401. The design information may be received in the form of a file (set of data) containing the components in the IC, their interconnections, timing information specifying (internal) time delays due to the components, etc. Such information is typically provided by the output of a design synthesis tool, as is well known in the relevant arts. Constraints merger block 440 also receives as inputs (via respective paths 414A-414N), timing constraints files 410A through 410N, with each of the files 410A-410N containing timing constraints specified for a corresponding one of 'N' timing modes of operation of the IC. It is assumed in this description that the IC may operate in 'N' timing modes, and thus is associated with 'N' timing constraints files.

Constraints merger block 440 provides each of timing constraints file 410A-410N separately/sequentially (one at a time) to STA 420, (via path 442) along with complete design information received via path 401. In response, constraints merger block 440 receives (from STA 420, via path 442) information specifying the signals (data, clocks etc.) that would propagate through various nodes of the IC in the corresponding timing mode. STA 420 may identify each of the signals from the corresponding timing constraints file and then use the design information to determine the nodes to which each signal propagates.

It should be appreciated that STA 420 is being conveniently used for gathering information regarding presence/absence of various signals at the various nodes of the IC (and not for static timing analysis as in phase 160 of FIG. 1B. It may accordingly be appreciated that other techniques may be used to gather the same information from the timing constraint files and the design information of the IC. As described in detail below with illustrative examples, such information may be obtained by observing the case settings (if any) at each node. Zero-wire-load models may be used to model the delays during such analysis.

Constraints merger block 440 may store (via path 443) the received information in memory 430, and may access the stored information at various instances in the course of generating the consolidated set of timing constraints (super mode constraints). Thus, constraints merger block 440 processes the information in memory 430 to generate a single consolidated set of timing constraints, and stores these in a "super mode" timing constraints file 450 (via path 445).

Constraints merger block 440 may then invoke (via path 456) physical design tool 460, and provide the super mode timing constraints file 450 to physical design tool 460. The physical design tool may alternatively be invoked by an operator/user and be provided the super mode constraints file. Physical design tool 460 operates on the single consolidated set of timing constraints 450 to place and route the circuit, with the general steps of static timing analysis and constraints updating, etc, as shown by blocks 160, 170 and 180 of FIG. 1 being repeated if required (constraints 150 being replaced by super mode timing constraints file 440 n such a scenario) to generate final placed- and routed IC meeting all timing requirements.

Various operations that may be performed by constraints merger block 440 in generating the super mode timing constraints file are described next with illustrative examples.

5. Detailed Operations Involved in Merging Timing Constraints

In an embodiment, the consolidation procedure to obtain the super mode constraints is performed such that a place-and-route optimization (performed (by a physical design tool) using (only) the super mode constraints) ensures that all the different timing modes are accommodated (taken into account/comprehended by the place and route tool) during optimization of the place-and-route operation, i.e., the worst of timing slacks at a node/path among the multiple modes of operation is optimized (made zero or positive). Various operations performed by constraints merger block 440 (in association with the other blocks shown in FIG. 4) involved in generating the consolidated set of constraints are described next with respect to example circuits in FIG. 5 and FIG. 9, and the constraints files/tables shown in FIGS. 6A-6B, 7, 10A-10C.

Figure 5:
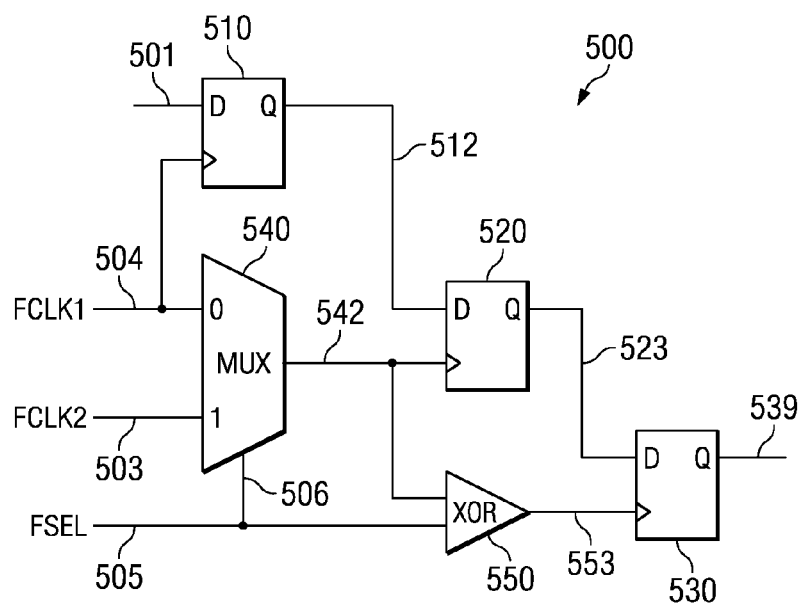
FIG. 5 is an example circuit used to illustrate the manner in which clock constraints are consolidated in an embodiment of the present invention.

FIG. 5 shows circuit 500 containing flip-flops 510, 520 and 530, multiplexer 540 and exclusive-OR (XOR) gate 550. Flip-flop 510 provides on output (Q, path 512) the input data 501 stored at an active edge of clock on path 504 (FCLK1). Similarly, flip-flops 520 and 530 provide as outputs 523 and 539, respective inputs 512 and 523 stored at the active edges of clocks on paths 542 and 553. Multiplexer (MUX) 540 has a control input 506, and forwards FCLK1 (504) on path 542 if signal FSEL (505) is a logic 0 (i.e., control input 506 is a logic 0), and FCLK2 (503) on path 542 if signal FSEL (505) is a logic 1. XOR gate 550 provides on path 553 the result of an exclusive-OR operation on inputs 542 and 505. It is assumed that the circuit of FIG. 5 may be operated in two possible timing modes, one (mode F1) in which FSEL (505) is a logic 0, and the other (mode F2) in which FSEL (505) is a logic 1.

Constraints merger block 440 receives two timing constraints files 610 and 620, respectively specifying the constraints for timing modes F1 and F2, as shown in the tables of FIGS. 6A and 6B respectively. The constraints are shown in tabular form in the Figures merely for the purpose of illustration, and the specific syntax used to describe the constraints shown there may vary depending on the particular physical design tool used. An example format in which the timing constraints may be specified is the Standard Design Constraints (SDC) format. Other proprietary formats can also be used in alternative embodiments.

File 610 specifies (to a physical design tool) that FCLK1 needs to be constrained to have a period of 1.1 ns (nanoseconds), FCLK2 needs to be constrained to have a period of 1.2 ns, and that FSEL is to have a value of zero. File 620 specifies that FCLK1 needs to be constrained to have a period of 1.1 ns (nanoseconds), FCLK2 needs to be constrained to have a period of 1.2 ns, and that FSEL is to have a value of one.

Constraints merger block 440 determines the signals that would propagate through the various nodes of circuit 500, in each of the two timing modes (for example, by providing STA 420 tool with one of the two timing constraints at a time, as well as the details of circuit 500. By observation of circuit 500, it may be noted that in mode F1, clock FCLK1 propagates (without inversion) to the clock inputs of flip-flops 510, 520 and 530, while clock FCLK2 does not propagate beyond the input of MUX 540. In mode F2, clock FCLK1 propagates (without inversion) to the clock input of flip-flop 510 only, while clock FCLK2 propagates (without inversion) to the clock input of flip-flop 520, and with inversion (due to the XOR operation at XOR gate 550) to the clock input of flip-flop 530.

Having determined the signal propagation information noted above, constraints merger block 440 creates for each clock in the circuit (FCLK1 and FCLK2 in the example), a corresponding qualified clock whose characteristics need to be specified as corresponding constraints in the super mode set. With respect to the above example, constraints merger block 440 creates qualified clocks FCLK1_F1, FCLK1_F2, FCLK2_F1, and FCLK2_F2.

FCLK1_F1 represents FCLK1 in mode F1. FCLK1_F2 represents to FCLK1 in mode F2. FCLK2_F1 represents FCLK2 in mode F1, and FCLK2_F2 represents FCLK2 in mode F2. It is noted that the clock name changes need be done only in the constraints files. The physical port of the corresponding design can have a different name from the clock name, and the constraints file(s) can specify which physical port a corresponding clock signal is applied on.

The constraints for each of the qualified clocks are maintained the same as the corresponding clocks which they qualify. Thus, for example, the period of clock FCLK1_F1 (after creation) is maintained to be the same as clock FCLK1 (1.1 ns). Assuming the individual constraint files 610 and 620 specify other constraints (such as clock uncertainty, skew, etc), the corresponding qualified clocks are created with the same constraints.

In general, all clocks from all timing modes are maintained in the super mode with the same waveforms, source locations, latencies, uncertainties and other properties as specified in the individual timing modes. Constraints merger block 440 enters the corresponding clock constraints in the super mode constraints file 700 (FIG. 7). Constraints merger block 440 identifies interactions between clocks of different modes, and specifies the corresponding interacting paths (e.g., data paths) as false paths (thereby indicating to the physical design tool that such paths need not optimized, and are therefore in a 'don't care' condition).

With respect to circuit 500 (FIG. 5), it may be observed that in mode F2, flip-flop 510 is clocked by FCLK1, while flip-flop 520 is clocked by FCLK2. Hence, data path 512 is identified as a false path. In general, any path connecting (output of) an element (such as a flip-flop) clocked by an 'F1-mode' clock and an input of an element clocked by an 'F2-mode' clock, is identified as a false path. Super mode constraints file 700 is shown containing the following two corresponding entries (last two rows of the table of FIG. 7):

From: *_F1 clocks To: *_F2 clocks, and
From: *_F2 clocks To: *_F1 clocks, wherein '*' represents a wild card character entry.

Inter-clock uncertainty (if any) specified in a timing mode is also included in the super mode set, between the corresponding super mode clocks.

Constraints merger block 440 also processes the arcs and case settings in each of the input timing constraints files. As is well known, an arc represents an internal path from an input to an output of the same component. A case setting specifies the specific arc, which would be used in a corresponding specific mode.

For case settings that are the same for all timing modes, constraints merger block 440 enters (in the super mode constraints set) the same case settings and arc-disable specifications.

On the other hand, for case settings which are not the same for all timing modes (e.g., as shown in FIGS. 6A and 6B), constraints merger block 440 determines clock tree nodes at which clock propagation is conditional. Such nodes may be termed clock-shaping nodes.

For example, buffers and inverters in the clock tree propagate the clock the same way in all timing modes, and hence do not constitute clock-shaping nodes. However, output pins of multiplexers, clock-gating cells and other combinational elements in the clock tree may be deemed as clock-shaping nodes. Constraints merger block 440 may initially treat all nodes in the clock tree that have a fan-in greater than one as potential clock-shaping nodes.

Clocks propagating in each timing mode to potential clock-shaping nodes (as well as nodes in its immediate fan-in) are noted by constraints merger block 440. Clocks noted to be present at the fan-in node (e.g., 504/503), but not at the potential clock-shaping node (542) constitutes a clock-stop of the clock at the potential clock-shaping node in that mode. Such clock-stop information is noted.

In addition, if a clock noted at a fan-in node is also noted at a potential clock-shaping node, it is checked if arcs of both positive and negative unateness are present between the fan-in node and the potential clock-shaping node. While checking for presence of arcs between the nodes, disabled arcs are also considered as being present, whether they are disabled by case settings or explicitly. If arcs of both positive and negative unateness are present in a cell (component such as a multi-plexer), which of the two unatenesses is enabled in a timing mode is noted, and correspondingly a clock-unateness of the clock at the potential clock-shaping node in that mode is also noted.

As is well-known in the relevant arts, unateness generally refers to whether a signal at a node is in inverted form or non-inverted form. If constraints merger block 440 infers either a clock-stop or a clock-unateness at a potential clock-shaping node in any timing mode, constraints merger block 440 identifies such a node as an actual clock-shaping node. The clock-unateness inferred can be one of positive, negative or both, depending on whether the set of enabled arcs include respectively only positive unate arcs, only negative unate arcs or both. If arcs of unateness are present (in the unateness check noted above), then the type of unateness enabled in each mode is checked.

If the set of arcs enabled in a mode has only positive unate arcs, the arc is marked as positive unate in the mode. If the set of arcs enabled in a mode has only negative unate arcs, the arc is marked as negative unate in the mode. If the set of arcs enabled in a mode has both positive and negative unate arcs, the arc is marked as non-unate in the mode. Corresponding clock-stop and clock-unateness constraints are added in the super mode set. If arcs of only positive unateness or only negative unateness are present between the fan-in node and the potential clock-shaping node, and not both, then no clock-unateness constraints are added in the supermode for this potential clock-shaping node.

An illustration of consolidation (determination and addition) of clock-stop and clock-unateness constraints in the super mode set is now provided with respect to circuit 500 of FIG. 5, and FIGS. 8A and 8B. From the design information of circuit 500 provided to it, constraints merger block 440 identifies each of MUX 540 and XOR gate 550 as being multi-input cells (components), and also as being a part of the clock tree. Hence, as described above, constraints merger block 440 identifies output 542 of MUX 540 and output 553 of XOR gate 550 as potential clock-shaping nodes.

Constraints merger block 440 notes that the clocks FCLK1 and FCLK2 propagate to the inputs (503 and 504) of MUX 540 in both modes F1 and F2. Further, constraints merger block 440 notes that output 542 of MUX 540, as well as output 553 of XOR gate 550 are clock shaping nodes. As shown in table 810 of FIG. 8A, constraints merger block 440 identifies that FCLK2 is stopped at output 542 of MUX 540 in mode F1, and FCLK1 is stopped at output 542 of MUX 540 in mode F2. It may be noted that the clock-stops result due to the action (logic value) of FSEL (505).

Constraints merger block 440 also notes the clock unateness of enabled arcs (path 542 to 553) of XOR gate 550, and generates the clock-unateness information shown in table 820 of FIG. 8B. It may be verified that (as noted in table 820) in mode F1, FCLK1 is forwarded with the same polarity on out 553 (no-inversion or positive unateness) by XOR gate 550, since FSEL equals logic 0 in mode F1.

In mode F2, FCLK2 is forwarded with the reversed polarity (inversion or negative unateness) on output 553 by XOR gate 550, since FSEL equals logic 1 in mode F2. Constraints merger block 440 enters constraints specifying the inferred clock-stops and clock-unateness information of tables 810 and 820 in the super mode constraints set, as shown in table 830 of FIG. 8C. In table 830, the first row specifies a constraint to stop propagation of clock FCLK2_F1 (created in a manner described above with respect to FIG. 7) at the node 542 of MUX 540. The entries in the other rows have corresponding meanings.

Although, the examples of FIGS. 8A, 8B and 8C describes generation of super mode constraints for case settings and arc-disable specifications with respect to multiplexers and XOR gates, similar constraints may be generated when other components such as clock-gators and combinational cells operate as clock-shaping nodes.

The above examples with respect to circuit 500 of FIG. 5 illustrate the manner in which super mode constraints are generated in an embodiment of the present invention for clock signals.

6. Data Signals

The manner in which constraints are consolidated for data signals is described next with respect to the example circuit (900) of FIG. 9, which is shown containing flip-flops 910, 920, 980, and 990, combinational logic 930, 940, 960 and 970, and MUX 950. Each of flip-flops (registers, in general) is clocked by the same clock tree. It is assumed that circuit 900 is operable in three modes, F1, F2 and SCAN mode. It is noted here that the term timing mode as used in this application includes SCAN mode, which is a test mode for testing circuit 900. The remaining timing modes may be termed as non-test timing modes. The value of select signal SEL (902) determines which of the two inputs 935 and 945 is provided by MUX 950 on path 956.

In modes F1 and F2, scan enable (SCANEN) 907 is logic 0, and data input to flip-flop 990 is provided via path 969 (D input of flip-flop 990). In SCAN mode, SCANEN (907) is logic 1, and data input to flip-flop 990 is provided on path 979 (SD input of flip-flop 990). Path 979 receives the combinational logic output of combinational block 970, one of the inputs to combinational block 970 being output 987 of flip-flop 980. Path 905 provides the data input to flip-flop 980. In mode F1, clock (901) nodes/paths receive a clock signal (named FCLK) with a period of 1.1 ns, while in mode F2, clock (901) nodes/paths receive a clock signal (also named FCLK) with a period of 1.2 ns.

In SCAN mode, clock (901) nodes/paths receive a test clock signal (named TCLK) with a period of 3.0 ns. The three respective constraints for modes F1, F2 and SCAN are shown in tables 1010, 1020 and 1030 of FIG. 10A. All data nodes in tables 900 have arrival times with respect to clock FCLK in modes F1 and F2, and with respect to clock TCLK in mode SCAN.

With respect to data signals, for case settings that are the same for all timing modes, constraints merger block 440 enters (in the super mode constraints set) the same case settings and arc-disable specifications (same as with clock signals described above).

For case settings and arc-disable specifications that affect data propagation differently in different timing modes, constraints merger block 440 identifies the arcs in the circuit that get disabled because of the case setting, as also the clock that cause a signal arrival at the nodes of the disabled arcs in the modes that disable them. Constraints merger block 440 then creates corresponding false path constraint entries in the super mode set.

Figure 9:
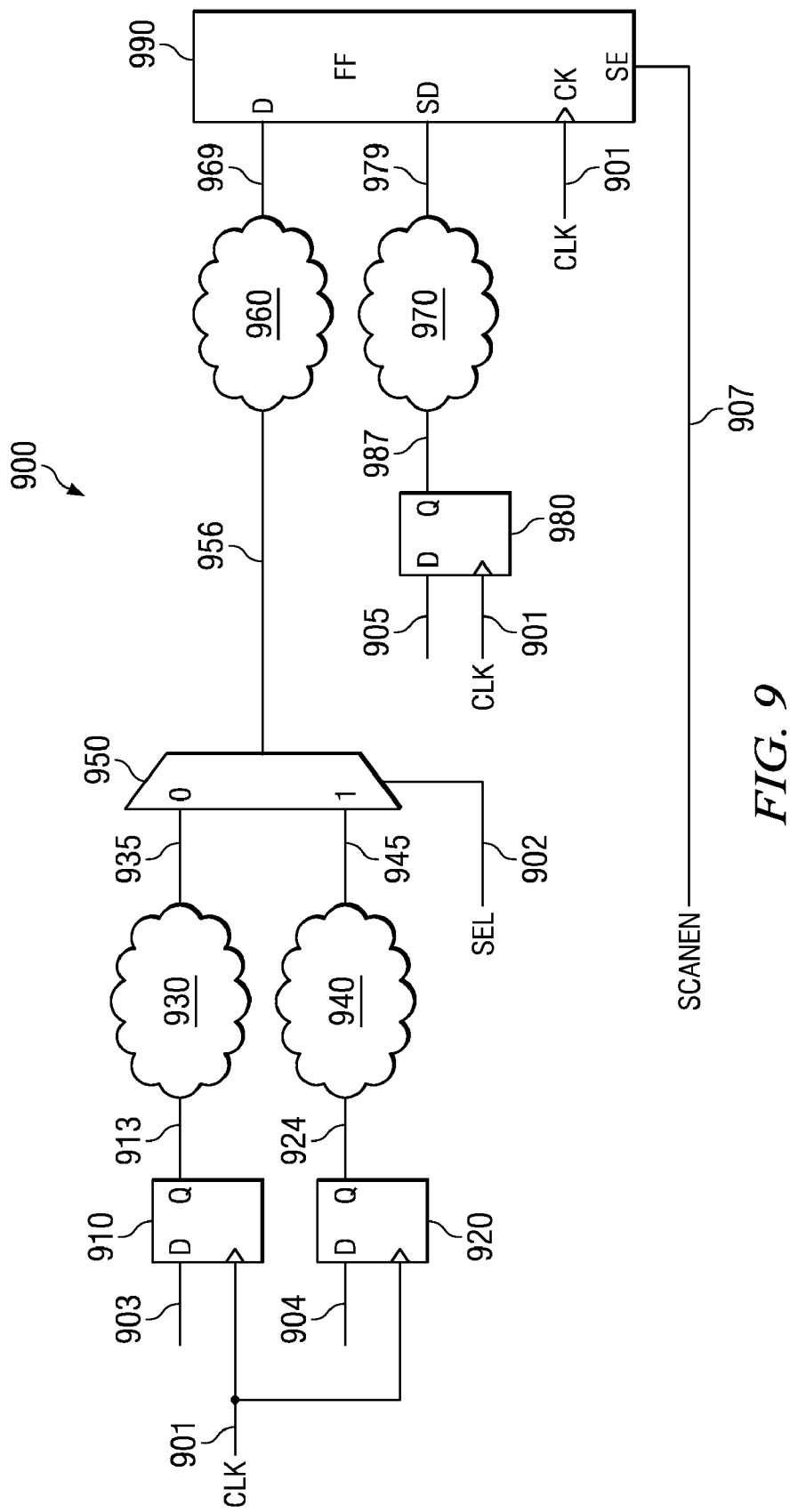
FIG. 9 is an example circuit used to illustrate the manner in which data path constraints are consolidated in an embodiment of the present invention.

To illustrate with respect to circuit 900 of FIG. 9, constraints merger block 440 receives constraints 1010, 1020 and 1030 corresponding to modes F1, F2 and SCAN respectively. As described above, constraints merger block 440 creates respective qualified clocks FCLK_F1, FCLK_F2, and TCLK_SCAN, each corresponding to the clock (and having the same properties, like period, etc., as noted above) propagating on node CLK (901) in each of the respective modes F1, F2 and SCAN. Constraints merger block 440 then identifies the arcs that get disabled in each mode.

With respect to FIG. 9, it may be observed that in SCAN mode, arcs from each of nodes 935 and 945 to node 956, and further onto node 969 are 'disabled' paths, since data input to flip-flop 990 is provided via SD input 979. Constraints merger block 440, accordingly, notes the entries shown in rows R1 and R2 of table 1050 (FIG. 10B). Similarly, the arc from node 902 (SEL) to node 956 is also a disabled arc, as noted in row R3.

In both of modes F1 and F2, setup and hold time requirements of flip-flop 990 with respect to clock input (CK, connected to node CLK (901)) and scan data (SD (979)) are in a 'don't care' condition, since flip-flop 990 receives input data on path 969. This is noted in row R4. Setup and hold time requirements with respect to clock input CK and scan enable input (SE) of flip-flop 990 is also disabled, as noted in row R5. In SCAN mode, setup and hold time requirements with respect to clock input CK and D input (969) are disabled, as noted in row R6.

The super mode constraints corresponding to the received constraints of tables 1010, 1020 and 1030 (FIG. 10A) are shown in table 1060 of FIG. 10C. It may be noted that since there are no case settings common to all the three modes F1, F2 and SCAN (as may be noted from tables 1010, 1020 and 1030 of FIG. 10A), constraints merger block 440 does not create any case setting constraints in the super mode.

As noted above, constraints merger block 440 creates qualified clocks (in the super mode) FCLK_F1, FCLK_F2 and TCLK_SCAN, corresponding to each mode. With the information created in table 1050 of FIG. 10B, and with the knowledge of the clocks involved in causing the arrivals at the nodes involved, constraints merger block 440 identifies and creates false path constraints in the super mode, as shown in table 1060 of FIG. 10C.

The entries in row R1 of table 1060 specify that data path from data outputs of registers clocked by FCLK_F1 through input 945 of MUX 950 to output 956 of MUX 950 is to be treated as a false path. Similarly, the entries in row R2 specify that data path from data outputs of registers clocked by FCLK_F2 through input 935 of MUX 950 to output 956 of MUX 950 is to be treated as a false path. Entries in rows R3, R4, R5 and R6 have corresponding meanings.

The CK to SE setup arc in flip-flop 990 is disabled by the SCAN_EN case setting in modes F1, F2 and SCAN (FIG. 10A), but the case setting value is different in different modes. Even though constraints merger block 440 does not include a SCAN-EN case setting in the super mode, constraints merger block 440 specifies disabling of the arc (CK to SE) adding an explicit arc-disable specification in the super mode constraints, as specified in row R5 table the super mode constraints table 1060 of FIG. 10C.

While the above example is illustrated with respect only to combinational, setup and hold arc types, constraints merger block 440 performs similar operations on other arc types. Examples of such arcs include sequential arcs (between input and output of a clocked element), recovery arc, removal arcs, clock gating checks, asynchronous arcs, etc.), and generates the corresponding super mode constraints in a manner described above.

Constraints merger block 440 processes path-specific exceptions, such as false paths, multicycle paths, maximum and minimum delay constraints handled, in the following manner. If in the path-specific exception, a constraint refers to one or more clocks in the "from", "to" or "through" clauses (e.g., in a manner similar to that noted with respect to table 1060 of FIG. 10C, but in a timing constraints file received as input and corresponding to an individual timing mode), the corresponding clocks are noted as the governing clocks (the clock that causes state change in the memory element) for that particular exception in that mode. The governing clocks are then replaced in the super mode exception with their corresponding qualified clocks in a manner described above, and the corresponding constraints are entered in the super mode set to specify the corresponding super mode exception.

On the other hand, if the exception in an individual mode is not specified with respect to any clocks, but only refers to structural elements, then the nodes specified in the "from", "to" or "through" clauses in the constraint, as well as the set of clocks that can cause a signal arrival at each of these nodes in that mode are noted. This set of clocks form the set of governing clocks for this exception in that mode. A new exception entry is made in the super mode set that retains all (or all equivalent) clauses of the original exception, and adds a "from" clause specifying the super mode constraint corresponding to the governing clocks.

Constraints merger block 440 includes in the super mode, all input delay and output delay constraints specified on ports (pins on an IC connecting to external circuitry) with respect to a clock in the input mode, with the clock name changed to the corresponding clock in the super mode, as noted above. For example, with respect to FIG. 5, if an input mode F1 has an input delay of 1 ns at FSEL with respect to clock FCLK1, it would be converted in the super mode to an input delay of 1 ns on FSEL with respect to clock FCLK1_F1.

Transitions or driving cells for input ports are worst cased across modes to arrive at the corresponding super mode constraint. For example, if the input transition range specified for port FSEL (505, FIG. 5) is [100 ps, 200 ps] in mode F1, and is [0 ps, 150 ps] in mode F2, then the super mode will have an input transition range of [0 ps, 200 ps] for port FSEL. Similarly, loads at output ports are also worst cased. For example, if the output load range specified at 539 in mode F1 is [10 pF, 20 pF] and that specified in mode F2 is [40 pF, 100 pF], the super mode will specify an output load range of [10 pF, 100 pF] for output port 539 (FIG. 5).

From the description above, it may be appreciated that a place and route tool (e.g., physical design tool 460 of FIG. 4) now need perform (and optimize) the place- and route operation using only the super mode timing constraints, as against using each of the separate constraints corresponding to each of the individual timing modes. As a result, run-time of the place-and-routes operation (speed) is faster, and the resource requirements (e.g., memory requirements such as size/speed of memory 430, FIG. 4) may be reduced.

Constraints merger block 440 may be implemented using software, hardware, or a combination of hardware and software. In general, when throughput performance is of primary consideration, the implementation is performed more in hardware (e.g., in the form of an application specific integrated circuit). When cost is of primary consideration, the implementation is performed more in software (e.g., using a processor executing instructions provided in software/firmware). Cost and performance can be balanced by implementing edge router 120 with a desired mix of hardware, software and/or firmware. An example embodiment implemented substantially in software is described next.

7. Digital Processing System

FIG. 11 is a block diagram illustrating the details of digital processing system 1100 in which various aspects of the present invention are operative by execution of appropriate software instructions. Digital processing system 1100 may be used to implement constraints merger block 440 described above.

Digital processing system 1100 may contain one or more processors such as a central processing unit (CPU) 1110, random access memory (RAM) 1120, secondary memory 1130, output interface 1160, network interface 1180 and input interface 1190. All the components may communicate with each other over communication path 1150, which may contain several buses as is well known in the relevant arts.

CPU 1110 may execute instructions stored in RAM 1120 to provide several features of the present invention. CPU 1110 may contain multiple processing units, with each processing unit potentially being designed for a specific task. Alternatively, CPU 1110 may contain only a single general-purpose processing unit. RAM 1120 may receive instructions from secondary memory 1130 using communication path 1150.

Input interface 1190 may correspond to a keyboard and a pointing device (e.g., touch-pad, mouse) and may be used to provide inputs (e.g., user requests to perform an operation on a remote system). Network interface 1180 provides connectivity to a network, and may be used to communicate with other connected systems (not shown).

Secondary memory 1130 may contain hard drive 1135, flash memory 1136, and removable storage drive 1137. Secondary memory 1130 may store the data (e.g., timing constraints files corresponding to individual timing modes) and software instructions, which enable digital processing system 1100 to provide several features in accordance with the present invention.

Some or all of the data and instructions may be provided on removable storage unit 1140, and the data and instructions may be read and provided by removable storage drive 1137 to CPU 1110. Floppy drive, magnetic tape drive, CD-ROM drive, DVD Drive, Flash memory, removable memory chip (PCMCIA Card, EPROM) are examples of such removable storage drive 1137.

Removable storage unit 1140 may be implemented using medium and storage format compatible with removable storage drive 1137 such that removable storage drive 1137 can read the data and instructions. Thus, removable storage unit 1140 includes a computer readable (storage) medium having stored therein computer software and/or data. However, the computer (or machine, in general) readable medium can be in other forms (e.g., non-removable, or removable, etc.).

In this document, the term "computer program product" is used to generally refer to removable storage unit 1140 or hard disk installed in hard drive 1135. These computer program products are means for providing software to digital processing system 1100. CPU 1110 may retrieve the software instructions, and execute the instructions to provide various features of the present invention described above.

Thus, the consolidated set (or super mode constraints) are generated programmatically according to an aspect of the present invention. A programmatic approach implies that execution of software instructions causes the content of the constraint files be examined and consolidated information be generated based on the content automatically (without user intervention).

It should be understood that numerous specific details, relationships, and methods are set forth to provide a full understanding of the invention. For example, many of the functions units described in this specification have been labeled as modules/blocks in order to more particularly emphasize their implementation independence.

A module/block may be implemented as a hardware circuit containing custom very large scale integration circuits or gate arrays, off-the-shelf semiconductors such as logic chips, transistors or other discrete components. A module/block may also be implemented in programmable hardware devices such as field programmable gate arrays, programmable array logic, programmable logic devices, or the like.

Modules/blocks may also be implemented in software for execution by various types of processors. An identified module of executable code may, for instance, contain one or more physical or logical blocks of computer instructions which may, for instance, be organized as an object, procedure, or function. Nevertheless, the executables of an identified module need not be physically located together, but may contain disparate instructions stored in different locations which when joined logically together constitute the module/block and achieve the stated purpose for the module/block.

It may be appreciated that a module/block of executable code could be a single instruction, or many instructions and may even be distributed over several code segments, among different programs, and across several memory devices. Further, the functionality described with reference to a single module/block can be split across multiple modules/blocks or alternatively the functionality described with respect to multiple modules/blocks can be combined into a single (or other combination of blocks) as will be apparent to a skilled practitioner based on the disclosure provided herein.

Similarly, operational data may be identified and illustrated herein within modules and may be embodied in any suitable form and organized within any suitable type of data structure. The operational data may be collected as a single data set, or may be distributed over different locations including over different member disks, and may exist, at least partially, merely as electronic signals on a system or network.

Reference throughout this specification to "one embodiment", "an embodiment", or similar language means that a particular feature, structure, or characteristic described in connection with the embodiment is included in at least one embodiment of the present invention. Thus, appearances of the phrases "in one embodiment", "in an embodiment" and similar language throughout this specification may, but do not necessarily, all refer to the same embodiment.

It should be understood that the figures and/or screen shots illustrated in the attachments highlighting the functionality and advantages of the present invention are presented for example purposes only. The present invention is sufficiently flexible and configurable, such that it may be utilized in ways other than that shown in the accompanying figures.

Further, the purpose of the following Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way.

What is claimed is:

1. A non-transitory, computer readable medium carrying one or more sequences of instructions for causing a digital processing system to facilitate designing of an integrated circuit (IC), wherein execution of said one or more sequences of instructions by one or more processors contained in said digital processing system for designing said integrated circuit causes said digital processing system to perform the actions of:

forming a set of data indicating a plurality of components of said IC, a plurality of connection paths and a timing information, wherein each connecting path provides a signal path between at least a pair of components, and said timing information specifying time delays expected in said plurality of components and said plurality of connection paths;

receiving a plurality of sets of timing constraints, wherein each timing constraint indicates a signal characteristic which needs to be accommodated, with each set pertaining to a corresponding one of said plurality of timing modes, and specifying a plurality of constraints for each of a plurality of signals in said integrated circuit;

consolidating said plurality of sets of timing constraints to generate a consolidated set of timing constraints;

wherein said consolidating comprises:
identifying a first set of constraints in said plurality of sets of timing constraints, wherein each of said first set of constraints corresponds to a same signal and is a same for all of said plurality of timing modes; and
adding a single constraint for each of said first set of constraints to said consolidated set;

passing said consolidated set of timing constraints to a physical design tool to generate a placed-and-routed circuit with a goal to accommodate said plurality of sets of timing constraints in view of said time delays;

processing said placed-and-routed circuit using a timing analysis tool to check whether said timing information is satisfied by said placed-and-routed circuit; and if said timing information is satisfied, concluding that said placed-and-routed circuit is ready for fabrication, wherein the circuit design method optimizing said consolidated set of timing constraints optimizes each timing constraint in said plurality of timing constraints;

identifying, for each of said timing modes, which signals would propagate through which of said nodes in said integrated circuit, whereby each of a first plurality of signals is identified to pass through a corresponding one of a first plurality of sets of nodes;

if a first signal in said first plurality of signals is a clock signal and if there is at least one constraint for said first signal not contained in said first set of constraints:

for each clock signal in said first plurality of signals, generate a corresponding qualified clock signal containing a same properties as said clock signal for each of said plurality of timing modes;

for each pair of qualified clock signals, identify corresponding false paths, wherein each false path is in a don't care condition in generating said placed and routed circuit; and adding a new set of constraints to said consolidated set, said new set containing said corresponding false paths and said corresponding qualified clock signals.

2. The computer readable medium of claim 1, if said first signal in said first plurality of signals is a clock signal and if there is at least one constraint, not contained in said first set of constraints, for said first signal, said computer readable medium further comprising:

identifying nodes in said integrated circuit, at which said first signal is not propagated further; and adding another new set of constraints to said consolidated set indicating said nodes at which said first signal is not propagated further.

3. The computer readable medium of claim 2, further comprising:

identifying unateness of said first signal; and adding a constraint to said consolidated set specifying said unateness.

4. The computer readable medium of claim 3, further comprises:

identifying clock shaping nodes in said integrated circuit, wherein each clock shaping node is designed to propagate a corresponding different clock signal in a corresponding timing mode.

5. The computer readable medium of claim 1, if a second signal in said first plurality of signals is a data signal and if there is at least one constraint for said second signal that is not included in said first set of constraints, said computer readable medium further comprising:

identifying nodes in said integrated circuit, at which said second signal is not propagated further due to a case setting;

identifying a corresponding clock signal which causes said second signal to arrive at nodes at which said second signal is not propagated further due to said case setting;

identify a path clocked by a corresponding qualified clock and which terminates at said nodes as a second false path; and adding another new set of constraints to said consolidated set indicating said second false paths.

* * * * *